United States Patent [19]
Kobayashi et al.

[11] Patent Number: 5,223,046
[45] Date of Patent: Jun. 29, 1993

[54] SUPER-MAGNETOSTRICTIVE ALLOY

[75] Inventors: Tadahiko Kobayashi; Yoichi Tokai; Masashi Sahashi, all of Yokohama, Japan

[73] Assignee: Kabushiki Kaisha Toshiba, Kawasaki, Japan

[21] Appl. No.: 845,827

[22] Filed: Mar. 6, 1992

Related U.S. Application Data

[63] Continuation of Ser. No. 413,291, Sep. 28, 1989, abandoned.

[30] Foreign Application Priority Data

Sep. 29, 1988 [JP] Japan ............... 63-242317
Aug. 18, 1989 [JP] Japan ............... 1-211423
Aug. 18, 1989 [JP] Japan ............... 1-211424

[51] Int. Cl.⁵ .............................. H01F 1/053
[52] U.S. Cl. ............................ 148/301; 420/416
[58] Field of Search ............... 148/301; 420/416

[56] References Cited

U.S. PATENT DOCUMENTS 4,375,372  3/1983  Koon et al. ............ 148/301
4,378,258  3/1983  Clark et al. ........... 148/100

FOREIGN PATENT DOCUMENTS 55-134150  10/1980  Japan .................. 420/416
59-158574   9/1984  Japan .................. 148/301
60-2645     1/1985  Japan .

OTHER PUBLICATIONS

Patent Abstracts of Japan, vol. 5, No. 4 (C-38) 13 Jan. 1981, & JP-A-55, 134150 (Toshiba Corp.) 18 Oct. 1980.
Patent Abstracts of Japan, vol. 9, No. 108 (C-280) 11 May 1985, & JP-A-60, 002645 (Toshiba Corp.) 8 Jan. 1985.

Primary Examiner—John P. Sheehan
Attorney, Agent, or Firm—Oblon, Spivak, McClelland, Maier & Neustadt

[57] ABSTRACT

A super-magnetostrictive alloy has a high coefficient of magnetostriction and satisfactory toughness. The first type of the super-magnetostrictive alloy has a composition whose atomic ratio is expressed by $(Tb_xDy_{1-x}(Fe_{1-y}Mn_y)_z$, where $0.35 \leq x \leq 0.9$, $0.001 \leq y \leq 0.6$, and $1.4 \leq z \leq 2.1$. The second type of the super-magnetostrictive alloy has a composition whose atomic ratio is expressed by $(Tb_xDy_{1-x}(Fe_{1-y-w}Mn_yT_w)_z$, where $0.2 \leq x \leq 0.9$, $0.05 \leq y \leq 0.4$, $0.05 \leq w \leq 0.1$, and $1.4 \leq z \leq 2.1$, and where T is at least one of Co and Ni. The super-magnetostrictive alloys of both types have a Laves-type intermetallic compound phase as a main phase, and a rare earth metal phase is located between the portions having the main phase.

8 Claims, 6 Drawing Sheets

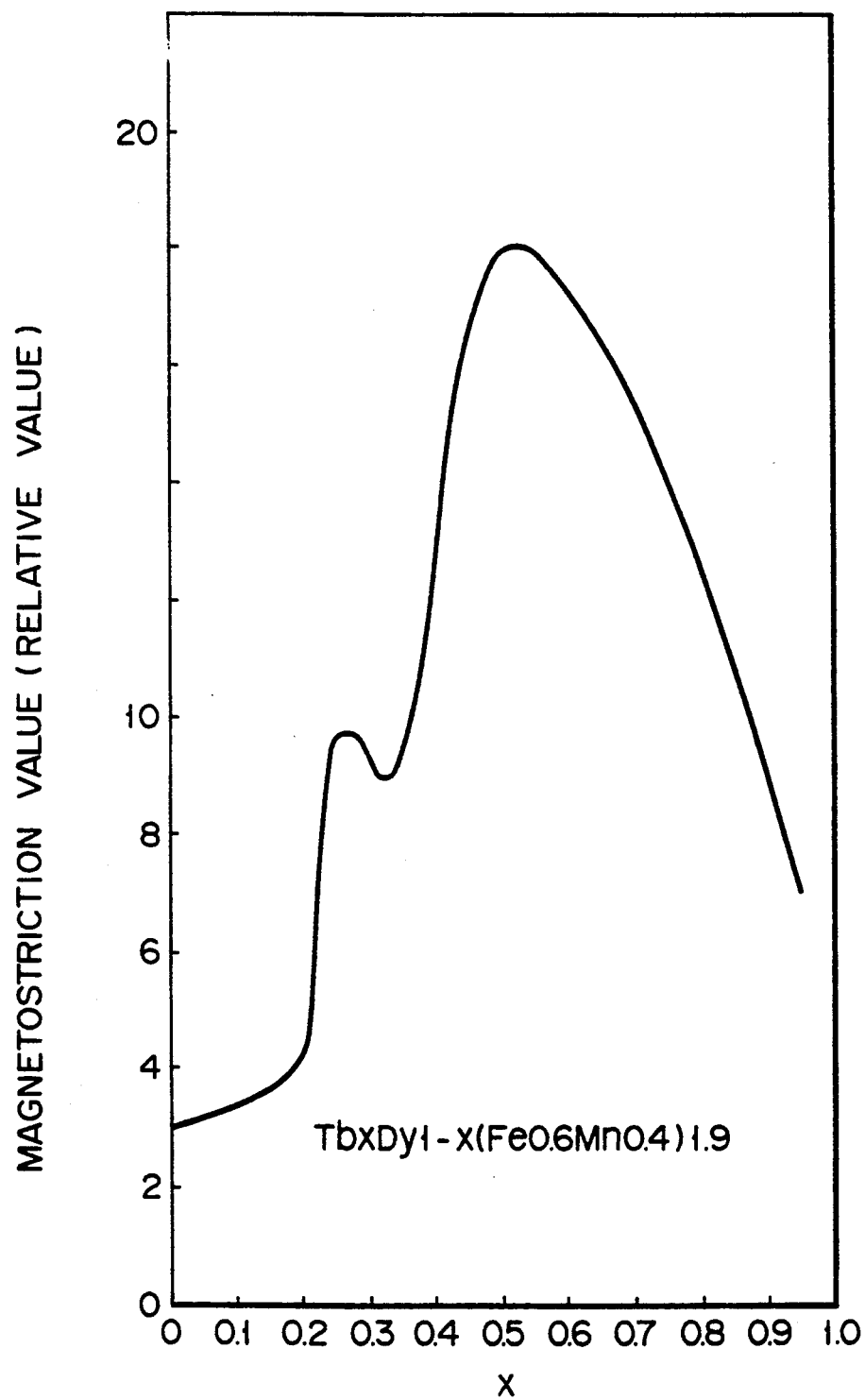
F I G. 1

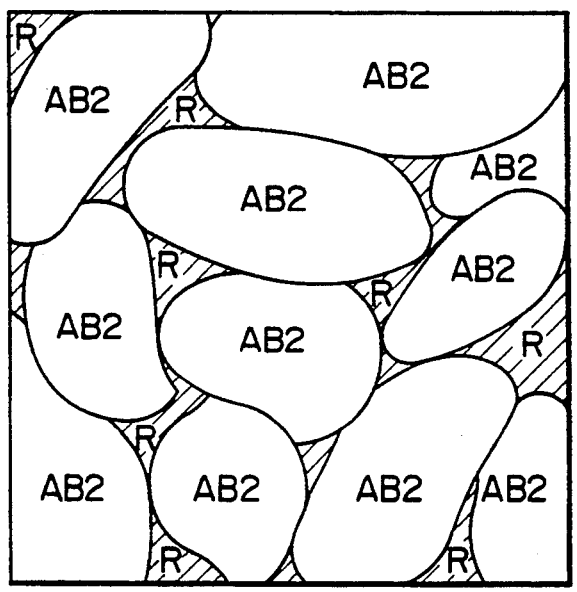
AB2 : LAVES-TYPE INTERMETALLIC COMPOUND
 : RARE EARTH METAL $\alpha$ -PHASE
F I G. 6

SUPER-MAGNETOSTRICTIVE ALLOY

This application is a continuation of application Ser. No. 07/413,291, filed on Sep. 28, 1989, now abandoned.

BACKGROUND OF THE INVENTION

1. Field of the Invention

The present invention relates to a super-magnetostrictive alloy having a high coefficient of magnetostriction and satisfactory toughness, and more particularly to a super-magnetostrictive alloy which is suitable for use as a primary element of a device designed to convert magnetic energy to mechanical energy and vice versa. Magnetostriction is stress which is caused in a magnetic material by application of an external magnetic field, and has an important application in devices known as a magnetostrictive filter, a magnetostrictive sensor, a magnetostrictive delay line, a magnetostrictive oscillator, etc.

2. Description of the Related Art

One result of recent progress made in instrumentation technology and developments in the field of precision instruments has been the widespread demand for displacement drivers, which are indispensable for the control of micro displacements in the order of microns. A conversion device designed to convert magnetic energy to mechanical energy and vice versa is an example of a device commonly used at present as a driving mechanism of a displacement driver.

An Ni-based alloy, an Fe-Co alloy, a ferrite are examples of conventionally known magnetostrictive materials. However, these examples produce only a small amount of magnetostrictive displacement, and are not suitable for use as the material of a displacement controller or driver required of precision in the order of microns.

U.S. Pat. No. 4,375,372 to Norman C. Koon et al. discloses a compound obtained from rare earth elements and iron, and U.S. Pat. No. 4,378,258 discloses a compound obtained from rare earth elements and 3d-transition elements. As is suggested in these U.S. patents, an intermetallic compound obtained from rare earth elements and iron produces magnetostriction which is nearly one hundred times as large as the magnetostriction of an Ni-based alloy, and is therefore suitable for producing sufficient magnetostrictive displacement. However, the compounds disclosed in the U.S. Patents do not covert magnetic energy to mechanical energy at high efficiency. In addition, they are fragile, so that they are not suitable for use as the material of a precision displacement controller or driver.

Japanese Patent No. 1370488 to Sahashi et al. (whose are the same inventors as the present invention), discloses that a Laves-phase intermetallic compound formed of a Dy-Tb-Fe-Mn alloy produces saturated magnetostrictive stress (λs) exceeding $1,000 \times 10^{-6}$. However, even the magnetostrictive materials shown in the Japanese Patent do not fully meet practical requirements, namely, the requirement that they produce great stress by application of a magnetic field of several kOe, and the requirement that they be very tough. One of the matters which should be considered when producing micro displacement is that the magnetostrictive characteristic of a magnetostrictive material is dependent, more or less, on the temperature at which the material is used. If the displacement i.e., a change in the magnetostrictive characteristic depends largely on the temperature, problems will arise in practice.

SUMMARY OF THE INVENTION

Accordingly, one object of the present invention is to provide a super-magnetostrictive alloy which produces great stress by application of a magnetic field as low as several kOe and converts electric energy to a mechanical displacement with high efficiency, and which is therefore suitable for use as the material of a displacement controller or driver required of precision in the order of microns.

Another object of the present invention is to provide a super-magnetostrictive alloy having satisfactory mechanical characteristics, such as toughness.

Still another object of the present invention is to provide a super-magnetostrictive alloy whose magnetostrictive constant does not greatly change in response to the ambient temperature thereof.

To achieve these objects, the present inventors conducted further researches with respect to Dy-Tb-Fe-Mn alloys. As a result, they found out that the Mn substituted for part of the F greatly change the magnetic anisotropy of rare earth magnetic elements. Dy and Tb are both rare earth magnetic elements but differ in magnetic anisotropy and examination of the relationship between the magnetostriction value and the Tb concentration with respect to Dy-Tb-Fe-Mn alloys showed that the magnetostrictive characteristic could be improved by increasing the Tb concentration of the alloys.

The super-magnetostrictive alloy according to the first embodiment of the present invention has a composition whose atomic ratio is expressed by $(Tb_xDy_{1-x})(Fe_{1-y}Mn_y)_z$ (where $0.35 \leq x \leq 0.9$, $0.001 \leq y \leq 0.6$, and $1.4 \leq z \leq 2.1$) and has a main phase formed by a Laves-type intermetallic compound.

The super-magnetostrictive alloy according to the second embodiment of the present invention has a composition whose atomic ratio is expressed by $(Tb_xDy_{1-x})(Fe_{1-y-w}Mn_yT_w)_z$ (where $0.2 \leq x \leq 0.9$, $0.05 \leq y \leq 0.4$, $0.05 \leq w \leq 0.1$, and $1.4 \leq z \leq 2.1$, and T is at least one of Co and Ni) and has a main phase formed by a Laves-type intermetallic compound.

In the alloys of the present invention, Tb (terbium) and Dy (dysprosium), both belonging to the rare earth element group, are alloy constituents necessary to obtain a satisfactory magnetostrictive characteristic since they have remarkable crystal magnetic anisotropy due to the large orbital angular momentum of the 4f electrons. Further, they are also necessary to provide the alloys with remarkable toughness. It should be also noted that Tb, Dy, and a Tb-Dy alloy produce remarkable magnetostrictive characteristics at a low temperature but do not show them at a temperature higher than the room temperature.

In the alloys of the present invention, Fe (iron) and Mn (manganese), both belonging to the 3d-transition element group, serve to form a Laves-type intermetallic compound with reference to Tb or Dy. They remarkably improve the magnetostrictive characteristics of Tb, Dy and Tb-Dy alloy at a temperature higher than the room temperature.

BRIEF DESCRIPTION OF THE DRAWINGS

FIG. 1 is a graph showing the relationship between the magnetostriction value and the composition ratio with respect to the super-magnetostrictive alloy of the first embodiment of the present invention;

FIG. 6 is a schematic view illustrating an alloy having a two-phase structure.

DETAILED DESCRIPTION OF THE PREFERRED EMBODIMENTS

The super-magnetostrictive alloy of the first embodiment of the present invention has a composition whose atomic ratio is expressed by $(Tb_xDy_{1-x})(Fe_{1-y}Mn_y)_z$, and its main phase is formed by Laves-type intermetallic compound. The ranges of x, y and z are as follows: $0.35 \leq x \leq 0.9$, $0.001 \leq y \leq 0.6$, and $1.4 \leq z  2.1$.

Figure 2:
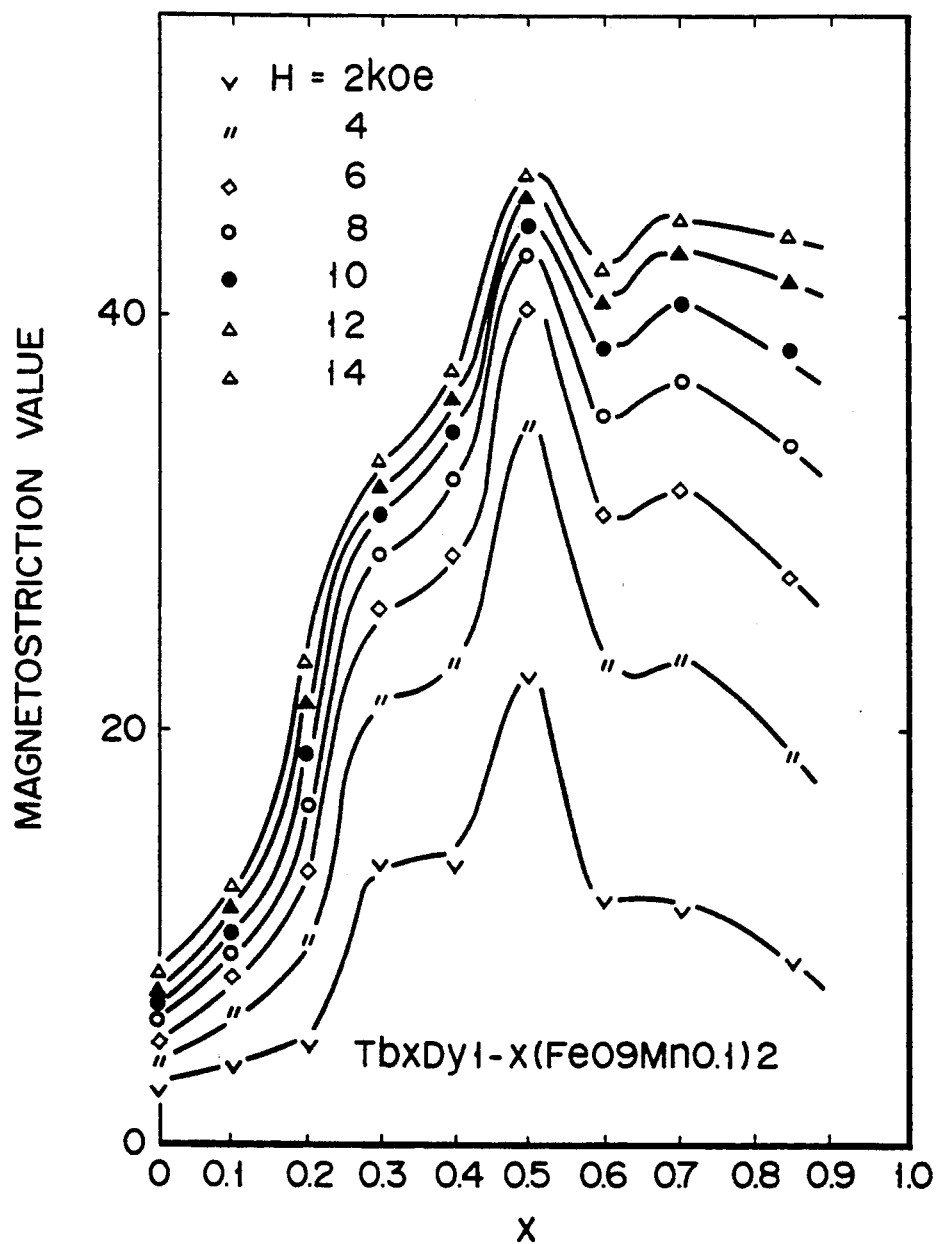
FIG. 2 is a graph showing the relationship between the magnetostriction value and the composition ratio with respect to the first embodiment the relationship being indicated with reference to different magnetic fields applied to the alloy.

With respect to the first embodiment, experiments were conducted to examine as to how function x representing the composition ratio of the rare earth elements was related to the magnetostrictive characteristic of the alloy. Results of this examination are shown in FIG. 1. The alloy used in the experiment had a composition position expressed by $Tb_xDy_{1-x}(Fe_{0.6}Mn_{0.4})1.9$. The magnetostrictive characteristic was estimated by use of the strain gauge method, with a magnetic field of up to 10 kOe applied. In the graph of FIG. 1, magnetostriction values are plotted along the ordinate. In consideration of the practicability of a driving system utilizing a low magnetic field (i.e., low input power), the magnetostriction values indicated in FIG. 1 are relative values which are obtained by normalizing the magnetostriction values of various-composition alloys applied with a magnetic field of 2 kOe by the magnetostriction values of DyFe 2 applied with the same magnetic field. FIG. 2 is a graph showing how the magnetostriction of the alloy having a composition of $Tb_xDy_{1-x}(Fe_{0.9}Mn_{0.1})_2$ changes by application of magnetic fields of different magnitudes. As is apparent from FIGS. 1 and 2, the magnetostriction amount of an alloy having a composition of $Tb_xDy_{1-x}$-Fe-Mn is large in the range of $0.35 \leq x \leq 0.9$, and has a very large peak value when x is nearly equal to 0.5.

When the x is in the above-noted range (i.e., between 0,35 and 0.9), the alloy produced a good magnetostrictive characteristic with reference to temperatures. This is attributable to the fact that the spin rearranging temperature decreased from −100° C. According to the present invention, the temperature-dependent variation rate of the magnetostrictive constant of the alloy is less than 40% when the temperature is between −100° C. and +100° C.

In the first embodiment, the lower limit of function y representing the composition ratio of the transition elements was determined to be 0.001, in consideration of the aspects of toughness and workability. If the value of y is too large, the Curie temperature of the alloy will decrease nearly to the room temperature, so that the alloy will be undesirably unstable in response to the ambient temperatures. Therefore, the upper limit of function y was determined to be 0.6. Preferably, the value of y should be in the range of $0.005 \leq y \leq 0.6$.

In the first embodiment, function z representing the ratio of the rare earth elements to the transition metals is within the range of $1.4 \leq z \leq 2.1$, preferably within the range of $1.4 \leq z \leq 1.95$. If z is larger than 2.1, a compound phase whose ratio of rare earth metals to transition metals is 1:3 will be produced, so that the magnetostrictive characteristic of the alloy will be adversely affected. If z is larger than 1.95, the Laves-type intermetallic compound will account for nearly 100% of the total volume of the alloy. In such a case, the alloy will have no rare earth metal phase which could exhibit good ductility. Such an alloy does not have sufficient toughness, is hard to work, and has a degraded magnetostrictive characteristic. For this reason, the upper limit of z is preferably 1.95. If z is smaller than 1.4, the Laves-type intermetallic compound will account for less than 50% of the total volume of the alloy, with the result that the magnetostrictive characteristic will be greatly degraded. Assuming that z is 2 and that the alloy comprised completely of a Laves-type intermetallic compound has a magnetostriction constant of 100, the magnetostriction constant of the alloy obtained when z is smaller than 1.4 has a magnetostriction constant in the range of 30 to 50. Since, in this case, the magnetostrictive characteristic of the alloy is greatly degraded, the alloy will not be useful in practice.

Figure 3:
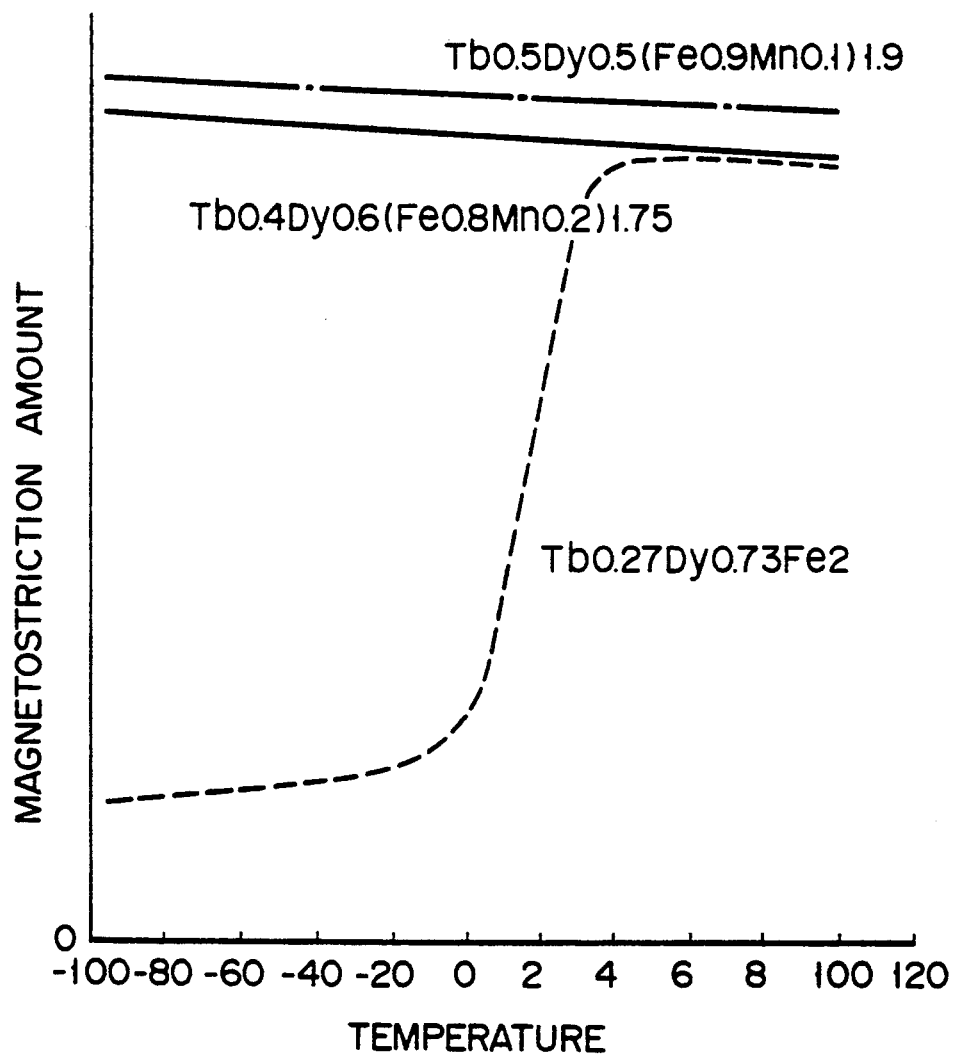
FIG. 3 is a graph showing how the magnetostriction of the first embodiment is related to temperature.

FIG. 3 shows how the magnetostriction amounts of the alloys of the first embodiment (the alloys having compositions expressed by $Tb_{0.5}Dy_{0.5}(Fe_{0.9}Mn_{0.1})_{1.9}$ and $Tb_{0.4}Dy_{0.6}(Fe_{0.8}Mn_{0.2})_{1.75}$, respectively) are related with temperatures. For comparison, FIG. 3 also shows how the magnetostriction amount of a comparative alloy having a composition expressed by $Tb_{0.27}Dy_{0.73}Fe_2$ is related with temperatures. In the case of the comparative example, the magnetostriction amount greatly varied at temperatures in the vicinity of the spin rearranging temperature. Therefore, the alloy of the comparative example is not suitable for practical use, since its magnetostrictive characteristic is largely dependent on temperature. In contrast, the alloys of the present invention, obtained by adding Mn to Tb-Dy-Fe alloys, show a satisfactory magnetostrictive characteristic in regions where the Tb concentration is high. Moreover, their magnetostriction amounts do not greatly vary in response to temperatures, since their spin rearranging temperatures are outside the range of −100° C. to +100° C.

The super-magnetostrictive alloy of the second embodiment of the present invention has a composition whose atomic ratio is expressed by $(Tb_xDy_{1-x})(Fe_{1-y-w}Mn_yT_w)_z$, and its main phase is formed by a Laves-type intermetallic compound. The ranges of x, y, w and z are as follows: $0.2 \leq x \leq 0.9$, $0.05 \leq y \leq 0.4$, $0.05 \leq w \leq 0.1$, and $1.4 \leq z \leq 2.1$, and T is at least one of Co and Ni.

The alloy of the second embodiment is obtained by including constituent T (i.e., at least one of Co [cobalt] and Ni [nickel]) into a Tb-Dy-Fe-Mn alloy. The inclusion of constituent T serves to compensate for a decrease in the Curie temperature of the alloy, which decrease is caused by the addition of Mn. In the above-noted composition formula, function w representing the composition of T(Co, Ni) should be preferably within the range of $0.05 \leq w \leq 0.1$. When w is within this range, the above-noted compensation effect is produced, so that magnetostrictive characteristic of the alloy is not much dependent on temperatures. If w is larger than the above range, the magnetostrictive characteristic of the alloy will be degraded. Conversely, if w is smaller than the range, the above-noted compensation effect will be adversely affected.

Figure 4:
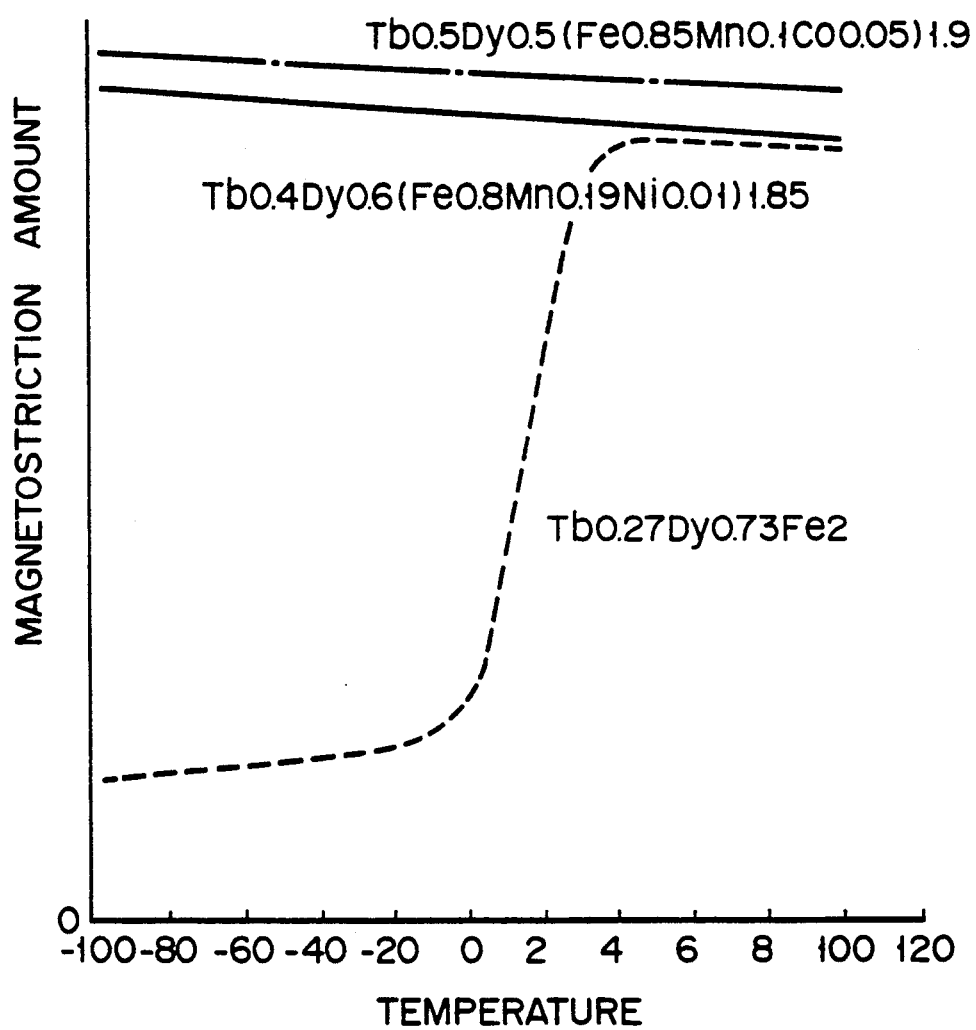
FIG. 4 is a graph showing how the magnetostriction of the super-magnetostrictive alloy of the second embodiment is related to temperature.

FIG. 4 shows how the magnetostriction amounts of the alloys of the second embodiment (the alloys having compositions expressed by $Tb_{0.5}Dy_{0.5}(Fe_{0.85}Mn_{0.1}Co_{0.05})_{1.9}$ and $Tb_{0.4}Dy_{0.6}(Fe_{0.8}Mn_{0.19}Ni_{0.01})_{1.85}$, respectively) related with temperatures. For comparison, FIG. 4 also shows how the magnetostriction amount of a comparative alloy having a composition expressed by $Tb_{0.27}Dy_{0.73}Fe_2$ is related with temperatures. As is apparent from FIG. 4, the magnetostriction amounts of the super-magnetostrictive alloys of the second embodiment hardly vary when a temperature is within a normally-used range (i.e., $-100°$ C. to $+100°$ C.). When a temperature is within this range, the characteristic of the alloys of the second embodiment is similar to those of the alloys of the first embodiment. Incidentally, however, the Curie temperatures of the alloys of the second embodiment is higher than those of the alloys of the first embodiment outside the above-noted temperature range.

Figure 5:
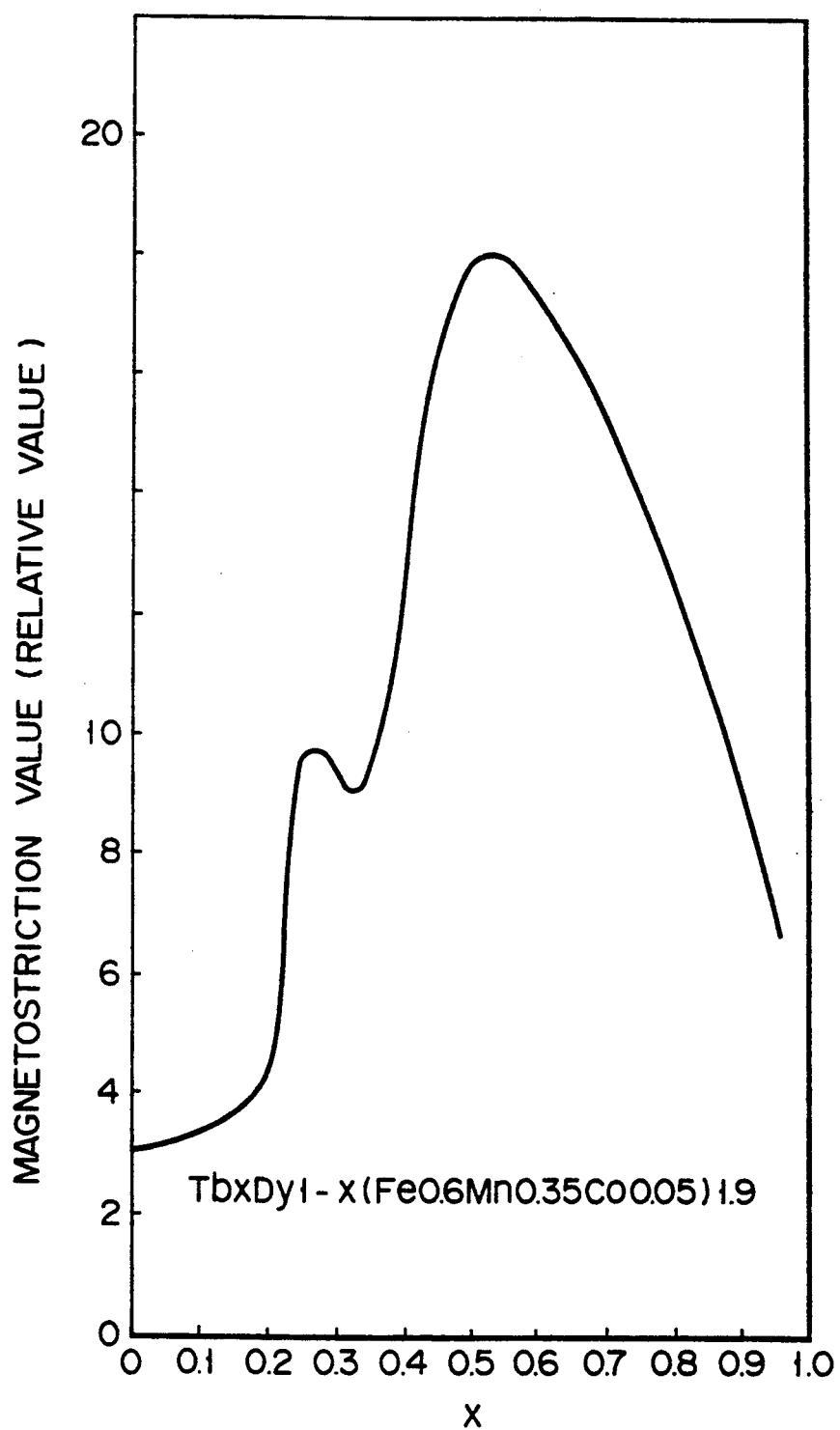
FIG. 5 is a graph showing the relationship between the magnetostriction value and the composition ratio with respect to the second embodiment.

When function x presenting the composition ratio of the rare earth elements is within the range of $0.2 \leq x \leq 0.9$, the alloys of the second embodiment have a satisfactory magnetostrictive characteristic. The relationship between x and magnetostrictive characteristic was examined, using an alloy expressed by $Tb_xDy_{1-x}(Fe_{0.6}Mn_{0.35}Co_{0.05})_{1.9}$. The result of this examination is shown in FIG. 5. In the examination, the magnetostrictive characteristic was estimated by use of the strain gauge method, with a magnetic field of up to 10 kOe applied. In FIG. 5, magnetostriction values are plotted along the ordinate. In consideration of the practicability of a driving system utilizing a low magnetic field (i.e., low input power), the magnetostriction values indicated in FIG. 5 are relative values which are obtained by normalizing the magnetostriction values of various-composition alloys applied with a magnetic field of 2 kOe by the magnetostriction values of DyFe 2 applied with the same magnetic field. As is apparent from FIG. 5, the magnetostriction amount of an alloy having a composition expressed by $Tb_xDy_{1-x}(Fe_{0.6}Mn_{0.35}Co_{0.05})_{1.9}$ is large in the range of $0.35 \leq x \leq 0.9$, and has a very large peak value when x is nearly equal to 0.5.

When the x is in the above-noted range (i.e., between 0.2 and 0.9), the alloy produced a good magnetostrictive characteristic with reference to temperatures. This is attributable to the fact that the spin rearranging temperature decreased from $-100°$ C. According to the present invention, the temperature-dependent variation rate of the magnetostrictive constant of the alloy is less than 40% when the temperature is between $-100°$ C. and $+100°$ C.

In the second embodiment, function y representing the composition ratio of the transition elements is in the range of $0.05 \leq y \leq 0.4$. If the value of y is too large, the Curie temperature of the alloy will decrease, causing a problem in practice. Conversely, if the value of y is too small, both the toughness and workability of the resultant alloy will be degraded.

In the second embodiment, function z representing the ratio of the rare earth elements to the transition metals is within the range of $1.4 \leq z \leq 2.1$, preferably within the range of $1.4 \leq z \leq 1.95$. If z is larger than 2.1, a compound phase whose ratio of rare earth metals to transition metals is 1:3 will be produced, so that the magnetostrictive characteristic of the alloy will be adversely affected. If z is larger than 1.95, the Laves-type intermetallic compound will account for nearly 100% of the total volume of the alloy. In such a case, the alloy will have no rare earth metal phase which could exhibit good ductility. Such an alloy does not have sufficient toughness, is hard to work, and has a degraded magnetostrictive characteristic. For this reason, the upper limit of z is preferably 1.95. If z is smaller than 1.4, the Laves-type intermetallic compound will account for less than 50% of the total volume of the alloy, with the result that the magnetostrictive characteristic will be greatly degraded. Assuming that z is 2 and that the alloy comprised completely of a Laves-type intermetallic compound has a magnetostriction constant of 100, the magnetostriction constant of the alloy obtained when z is smaller than 1.4 has a magnetostriction constant in the range of 30 to 50. Since, in this case, the magnetostrictive characteristic of the alloy is greatly degraded, the alloy will not be useful in practice.

In the super-magnetostrictive alloys of the first and second embodiments of the present invention, Tb and Dy are used as basic rare earth elements. However, as long as the characteristic of the alloy is not adversely affected, the following rare earth elements may be added: La, Ce, Pr, Nd, Pm, Sm, Eu, Gd, Ho, Er, Tm, Yb, Lu, Y, etc. The upper limit of the amount of these elements should not exceed 50% of the total amount of Tb and Dy.

In a super-magnetostrictive alloy of the present invention, Fe and Mn (which are major constituents of the alloy) form a Laves-type intermetallic compound, in conjunction with Tb and Dy. As a result, the alloy is improved in both workability and toughness, and has a satisfactory magnetostrictive characteristic particularly when the ambient temperature of the alloy is higher than the room temperature. The workability and toughness of the alloy are improved by using Fe and Mn from among various transition metals. They may be further improved if the fracture toughness value of the alloy is increased by distributing the $\alpha$-phases (R) of a rare earth metal (which exhibit good ductility) in the Laves-type intermetallic compound ($AB_2$), as is shown in FIG. 6. It should be noted, however, that the magnetostrictive characteristic of the alloy will be greatly degraded if the alloy contains a large amount of compound other than the the Laves-type intermetallic compound. In consideration of a graph showing the related thermal equilibrium state, the alloys of the present invention are limited to the transition metals and rare earth metals having the composition noted above.

The super-magnetostrictive alloys of the present invention may be polycrystalline substances, such as a cast substance and a sintered substance. Further, they may be substances whose crystal orientations can be controlled by use of, e.g., the one-direction coagulation process, or substances whose crystalline structures can be controlled by use of, e.g., the floating zone melt process. In the super-magnetostrictive alloys of the present invention, the magnetostriction will increase in the $<1,1,1>$ direction, so that the control made in this direction is expected to be effective.

EXAMPLES 1-11

Examples 1-11 of the super-magnetic alloys of the first embodiment of the present invention are shown in Table 1.

Each alloy was prepared by arc melting. After homogenized at a temperature of 900° C. for one week, the alloy was cut to obtain test pieces of 10 mm × 10 mm × 5 mm.

The magnetostrictive characteristic of each alloy was estimated at the room temperature by use of an antimagnetic gage, with a magnetic field of 2 KOe applied to the alloy by an electromagnet of an opposed magnetic pole type.

istic by application of a low magnetic field. In addition, they had a two-phase alloy structure made up of a Laves-type intermetallic compound phase and a rare earth metal $\alpha$-phase, so that it could be confirmed that their toughness was remarkably improved.

For comparison, conventionally-known alloys are also shown in Table 1 as comparative examples 1-5.

As is shown in Table 1, comparative example 1 produced a good magnetostrictive characteristic, but had poor toughness and was fragile. Comparative example 4 had good toughness, but had a very poor magnetostrictive characteristic. Comparative examples 2, 3 and 5 were poor in both magnetostrictive characteristic and toughness.

TABLE 1

| | Composition (atomic %) | Magnetostrictive characteristic | Toughness | Alloy structure | Temperature-dependent variation (%) |
|---|---|---|---|---|---|
| Examples | | | | | |
| 1 | $Tb_{0.4}Dy_{0.6}(Fe_{0.9}Mn_{0.1})_{1.5}$ | 12.6 | ○ | Two-phase | 30 |
| 2 | $Tb_{0.4}Dy_{0.6}(Fe_{0.9}Mn_{0.1})_{1.85}$ | 14.0 | ○ | " | 32 |
| 3 | $Tb_{0.7}Dy_{0.3}(Fe_{0.8}Mn_{0.2})_{1.95}$ | 13.0 | ○ | " | 14 |
| 4 | $Tb_{0.9}Dy_{0.1}(Fe_{0.8}Mn_{0.2})_{1.95}$ | 8.4 | ○ | " | 8 |
| 5 | $Tb_{0.35}Dy_{0.65}(Fe_{0.7}Mn_{0.3})_{1.9}$ | 9.4 | ○ | " | 38 |
| 6 | $Tb_{0.5}Dy_{0.5}(Fe_{0.7}Mn_{0.3})_{1.9}$ | 18.0 | ○ | " | 24 |
| 7 | $Tb_{0.7}Dy_{0.3}(Fe_{0.7}Mn_{0.3})_{1.9}$ | 15.2 | ○ | " | 16 |
| 8 | $Tb_{0.9}Dy_{0.1}(Fe_{0.7}Mn_{0.3})_{1.9}$ | 8.8 | ○ | " | 10 |
| 9 | $Tb_{0.5}Dy_{0.5}(Fe_{0.9}Mn_{0.1})_{1.95}$ | 20.0 | ○ | " | 20 |
| 10 | $Tb_{0.5}Dy_{0.5}(Fe_{0.5}Mn_{0.5})_{1.9}$ | 8.0 | ○ | " | 30 |
| 11 | $Tb_{0.85}Dy_{0.15}(Fe_{0.7}Mn_{0.3})_{2.1}$ | 10.5 | ○ | " | 12 |
| Comparative Examples | | | | | |
| 1 | $Tb_{0.3}Dy_{0.7}Fe_2$ | 12.0 | X | Single-phase | 187 |
| 2 | $Tb_{0.2}Dy_{0.8}(Fe_{0.6}Mn_{0.4})_2$ | 4.0 | Δ | " | 155 |
| 3 | $Tb_{0.1}Dy_{0.9}(Fe_{0.8}Mn_{0.2})_2$ | 5.0 | Δ | " | 80 |
| 4 | $Tb_{0.1}Dy_{0.9}(Fe_{0.9}Mn_{0.1})_{1.9}$ | 6.0 | ○ | Two-phase | 80 |
| 5 | $DyFe_2$ | 1.0 | Δ | Single-phase | 50 |

To compare the toughnesses of the alloys with each other, test pieces having the same shape (and having substantially the same weight) were made to drop onto an iron plate from a point 3 m above the iron plate. After 10 test pieces of the same composition were made to drop, they were examined to see whether or not they were broken. In the case where none of the ten test pieces were broken, the alloy of the test pieces was evaluated as . In the case where at least one of the ten test pieces was broken, the alloy was evaluated as Δ. In the case where all of the ten test pieces were broken, the alloy was evaluated as x.

The structure of each alloy was examined by use of an optical microscope and an energy diffusion type X-ray analyzer (EDX), to know whether it was in the single phase state or two-phase state.

How the magnetostriction amount of each example varied in response to temperatures was also measured in the temperature range of −100° C. to +100° C., with the magnetostriction amount at the room temperature represented by 1.

As is apparent from the examples shown in Table 1, the super-magnetostrictive alloys of the present invention produced a remarkable magnetostrictive character-

EXAMPLES 12-25

Examples 12-25 of the super-magnetic alloys of the second embodiment of the present invention are shown in Table 2. They were prepared and processed in the same manner as that of Examples 1-11, and were evaluated and observed in the same manner as that of Examples 1-11.

As is apparent from the examples shown in Table 2, the super-magnetostrictive alloys of the second embodiment showed remarkable magnetostrictive characteristics by application of a low magnetic field. In addition, they had a two-phase alloy structure made up of a Laves-type intermetallic compound phase and a rare earth metal $\alpha$-phase, so that it could be confirmed that their toughness was remarkably improved.

For comparison, conventionally-known alloys are also shown in Table 2 as comparative examples 6 and 7.

As is shown in Table 2, comparative example 6 showed a good magnetostrictive characteristic, but had poor toughness and was fragile. Comparative example 7 had good toughness, but had a very poor magnetostrictive characteristic.

TABLE 2

| | Composition (atomic %) | Magnetostrictive characteristic | Toughness | Alloy structure | Temperature-dependent variation (%) |
|---|---|---|---|---|---|
| Examples | | | | | |
| 12 | $Tb_{0.4}Dy_{0.6}(Fe_{0.85}Mn_{0.1}Co_{0.05})_{1.5}$ | 13.0 | ○ | Two-phase | 26 |

TABLE 2-continued

|  | Composition (atomic %) | Magnetostrictive characteristic | Toughness | Alloy structure | Temperature-dependent variation (%) |
| --- | --- | --- | --- | --- | --- |
| 13 | $Tb_{0.4}Dy_{0.6}(Fe_{0.8}Mn_{0.19}Ni_{0.01})_{1.85}$ | 14.0 | ◯ | " | 32 |
| 14 | $Tb_{0.7}Dy_{0.3}(Fe_{0.8}Mn_{0.18}Ni_{0.02})_{1.95}$ | 13.5 | ◯ | " | 15 |
| 15 | $Tb_{0.9}Dy_{0.1}(Fe_{0.8}Mn_{0.1}Co_{0.1})_{1.95}$ | 8.0 | ◯ | " | 7 |
| 16 | $Tb_{0.35}Dy_{0.65}(Fe_{0.6}Mn_{0.35}Co_{0.05})_{1.9}$ | 9.4 | ◯ | " | 36 |
| 17 | $Tb_{0.5}Dy_{0.5}(Fe_{0.6}Mn_{0.35}Co_{0.05})_{1.9}$ | 19.0 | ◯ | " | 23 |
| 18 | $Tb_{0.7}Dy_{0.3}(Fe_{0.6}Mn_{0.35}Co_{0.05})_{1.9}$ | 15.2 | ◯ | " | 16 |
| 19 | $Tb_{0.9}Dy_{0.1}(Fe_{0.6}Mn_{0.35}Co_{0.05})_{1.9}$ | 8.8 | ◯ | " | 11 |
| 20 | $Tb_{0.5}Dy_{0.5}(Fe_{0.85}Mn_{0.1}Co_{0.05})_{1.95}$ | 21.0 | ◯ | " | 22 |
| 21 | $Tb_{0.5}Dy_{0.5}(Fe_{0.59}Mn_{0.4}Ni_{0.01})_{1.9}$ | 8.5 | ◯ | " | 30 |
| 22 | $Tb_{0.85}Dy_{0.15}(Fe_{0.7}Mn_{0.3})_{1.9}$ | 9.0 | ◯ | " | 12 |
| 23 | $(Ho_{0.1}Tb_{0.4}Dy_{0.5})(Fe_{0.9}Mn_{0.05}Co_{0.05})_{1.8}$ | 11.0 | ◯ | Two-phase | 22 |
| 24 | $(Ho_{0.05}Tb_{0.5}Dy_{0.45})(Fe_{0.9}Mn_{0.05}Ni_{0.05})_{1.9}$ | 11.0 | ◯ | " | 20 |
| 25 | $(Nd_{0.1}Tb_{0.7}Dy_{0.2})(Fe_{0.8}Mn_{0.1}Ni_{0.1})_{1.7}$ | 9.8 | ◯ | " | 30 |
| Comparative Example |  |  |  |  |  |
| 6 | $Tb_{0.3}Dy_{0.7}Fe_2$ | 12.0 | X | Single-phase | 18 |
| 7 | $Tb_{0.1}Dy_{0.9}(Fe_{0.9}Mn_{0.1})_{1.3}$ | 3.0 | ◯ | Two-phase | 60 |

The present invention was detailed above, referring to preferred embodiments. However, the invention is not limited to the embodiments; it may be modified or improved in various manners without departing from the spirit and scope of the invention.

What is claimed is:

1. A super-magnetostrictive alloy having a Laves-structure intermetallic compound phase as a main phase, and having a composition whose atomic ratio is expressed by $(Tb_xDy_{1-x})(Fe_{1-y-w}Mn_yT_w)_z$, wherein the value of x is such that the content of Tb in the alloy is greater than 25 wt. % up to $x \leq 0.9$ and $0.05 \leq y \leq 0.4$, $0.05 \leq w \leq 0.1$, and $1.4 \leq z \leq 2.1$, and T is at least one of Co and Ni.

2. A super-magnetostrictive alloy according to claim 1, wherein x is approximately equal to 0.05.

3. A super-magnetostrictive alloy according to claim 1, wherein z is more than 1.9.

4. A super-magnetostrictive alloy according to claim 1, wherein z is less than 2.0.

5. A super-magnetostrictive alloy according to claim 1, wherein z is equal to or smaller than 1.95.

6. A super-magnetostrictive alloy according to claim 1, wherein a magnetostriction amount of the super-magnetostrictive alloy has a temperature-dependent variation rate of less than 40% in a temperature range between $-100°$ C. and $+100°$ C.

7. A super-magnetostrictive alloy according to claim 1, which contains additional rare earth elements other than Tb and Dy such that the additional rare earth elements account for less than about 50% of the total amount of Tb and Dy.

8. A super-magnetostrictive alloy according to claim 1, which has the formula: $(Tb_{0.4}Dy_{0.6})(Fe_{0.85}Mn_{0.1}Co_{0.05})_{1.5}$.

* * * * *

UNITED STATES PATENT AND TRADEMARK OFFICE
CERTIFICATE OF CORRECTION

PATENT NO. : 5,223,046
DATED : June 29, 1993
INVENTOR(S) : Tadahiko Kobayashi et al.

It is certified that error appears in the above-indentified patent and that said Letters Patent is hereby corrected as shown below:

On the title page, Item [63],

The Related U.S. Application Data is incorrect, should read:

--Continuation of Ser. No. 413,291, Sep. 27, 1989, abandoned.-- and in Column 1, Line 5, Change Sep. 28, 1989 to --Sep. 27, 1989--

Signed and Sealed this

Fifth Day of April, 1994

Attest:

BRUCE LEHMAN

*Attesting Officer*      *Commissioner of Patents and Trademarks*